United States Patent [19]
Ikenaka et al.

[11] Patent Number: 5,288,238
[45] Date of Patent: Feb. 22, 1994

[54] IC CHIP TO PC BOARD CONNECTOR SYSTEM

[75] Inventors: Kazuo Ikenaka, Machida; Deborah S. Schenberger, Sagamihara, both of Japan

[73] Assignee: ITT Industries, Inc., Secaucus, N.J.

[21] Appl. No.: 865,544

[22] Filed: Apr. 9, 1992

[30] Foreign Application Priority Data

Apr. 30, 1991 [JP] Japan .................................. 3-98968

[51] Int. Cl.$^5$ .................................................. H01R 13/00
[52] U.S. Cl. .................................................. 439/91; 361/760
[58] Field of Search ................ 439/69, 71, 73, 86-91; 361/400, 413

[56] References Cited

U.S. PATENT DOCUMENTS 4,843,313  6/1989  Walton .................................. 439/91

*Primary Examiner*—Joseph H. McGlynn
*Attorney, Agent, or Firm*—Thomas L. Peterson

[57] ABSTRACT

Apparatus is provided for connecting rows of contact pads on a leadless integrated circuit (22, FIG. 1) to rows of traces on a circuit board (24), which facilitates the connection and which facilitates substitution of a probe for the integrated circuit. The apparatus includes a socket (32) forming a largely rectangular cavity (34) which closely receives the integrated circuit (22), the socket having a lower portion with elongated slots (51-54), each slot holding an elastically compressible interface device (60). Each interface device has a row of compressible conductors each having an upper end engaging a contact pad (26) on the integrated circuit and a lower end engaging a conductive trace (30) on the circuit board. With the socket securely held to the circuit board, the socket can be used to hold a probe (220, FIG. 13) with a probe board (222) having contact pads (224) on its lower surface that can lie at the same locations as the contact pads on the integrated circuit when it lies in the socket. Each interface device can have contacts at a finer pitch than the contacts on the integrated circuit or the circuit board, to reduce the precision required in mounting the interface devices on the socket.

9 Claims, 8 Drawing Sheets

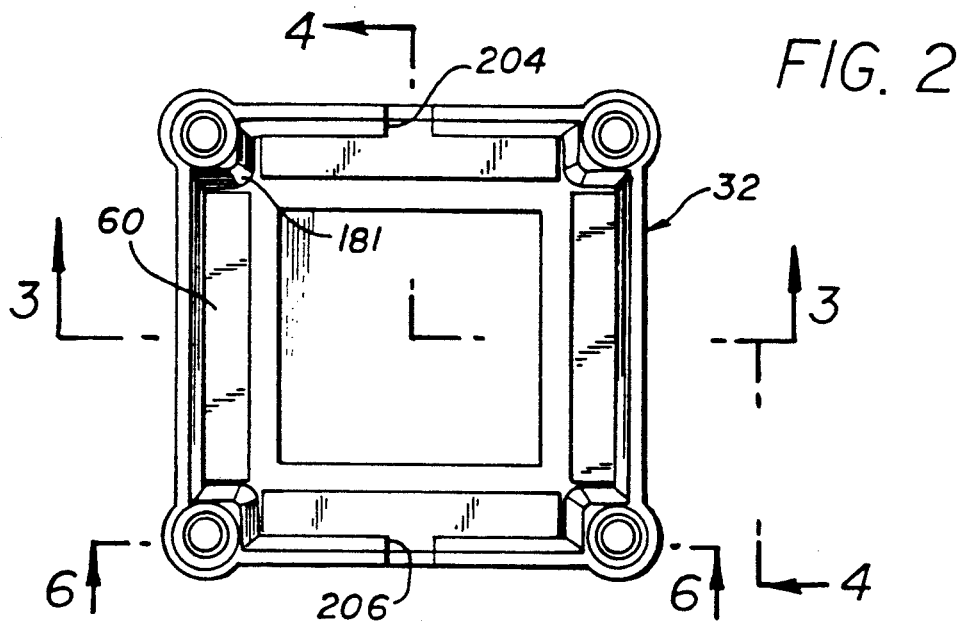
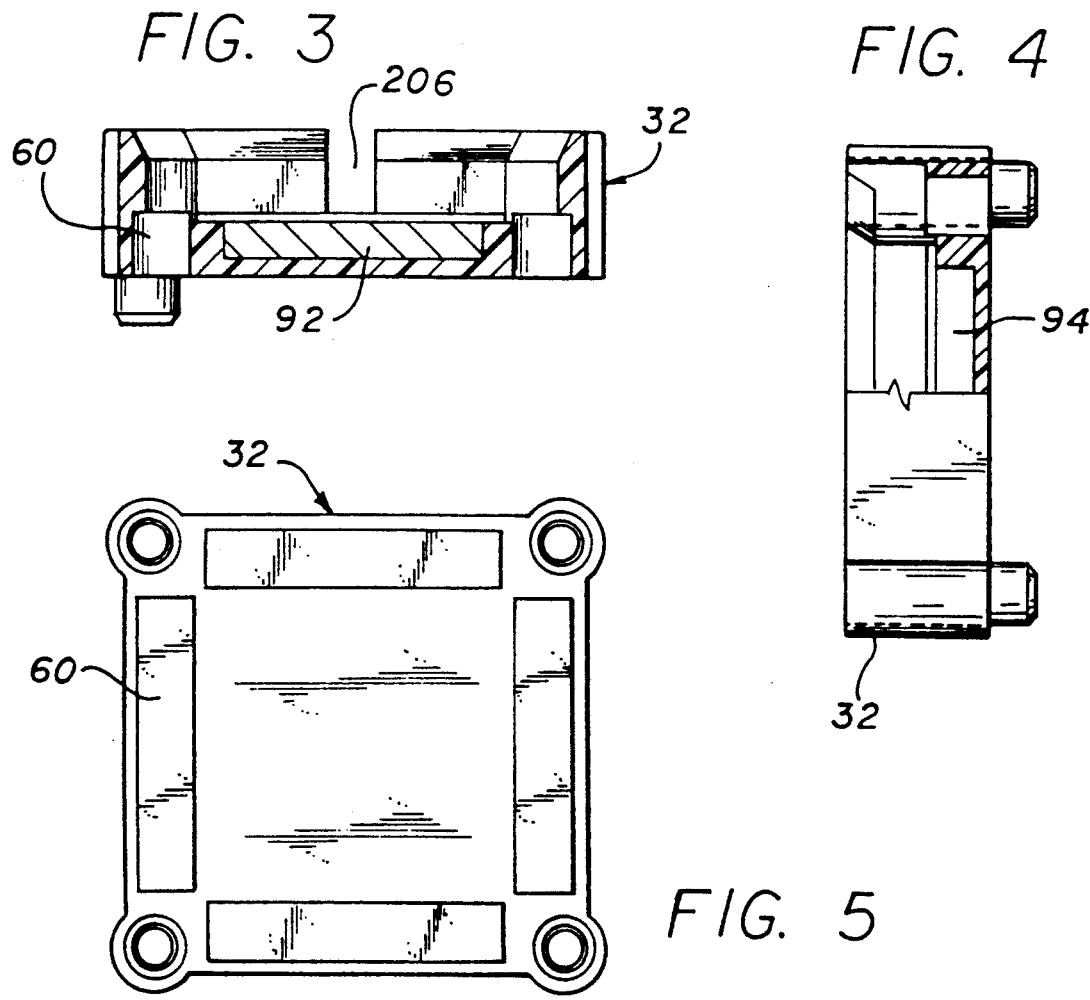

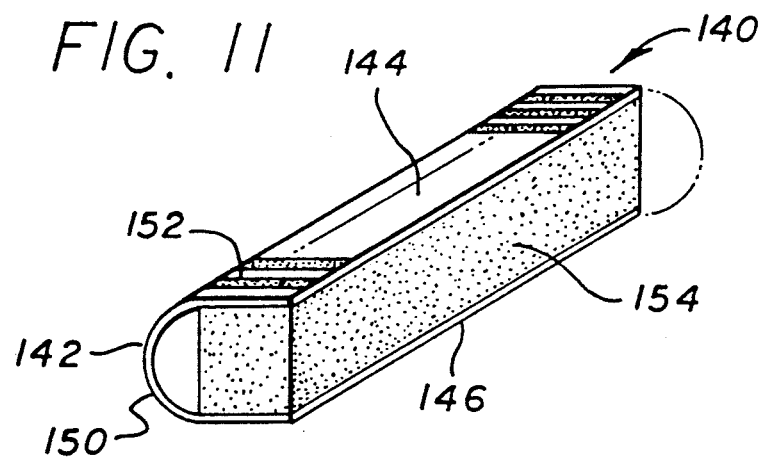
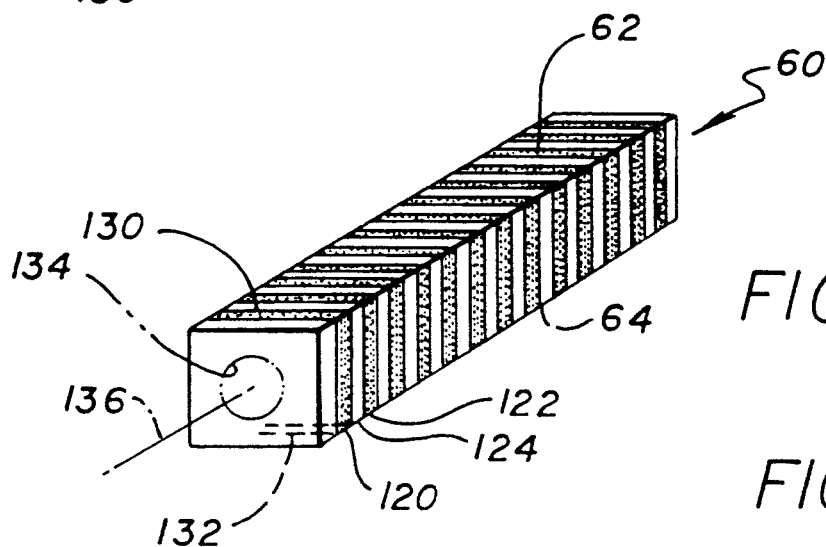
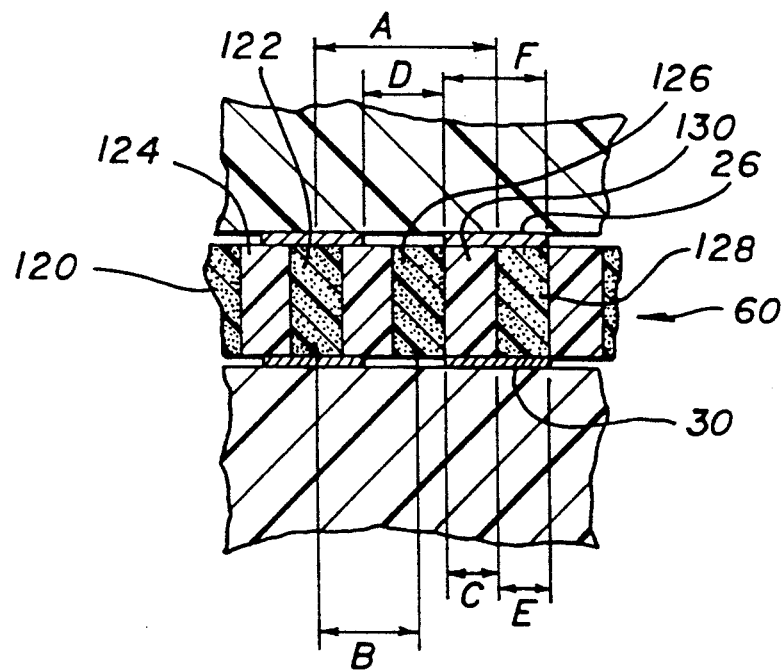

IC CHIP TO PC BOARD CONNECTOR SYSTEM

BACKGROUND OF THE INVENTION:

IC's (integrated circuits) are often mounted on circuit boards by the use of multiple wire leads on the IC or on a socket holding a leadless IC. The wire leads must be soldered to the circuit board even for testing the entire circuit with the IC in place. As the contact pitch has decreased to 0.5 mm and below, it has become difficult to hand solder the circuit for experimental purposes, and expensive automated soldering equipment is required which also may be limited in the contact pitch it can be used with. The soldering requirement makes it difficult to connect a test probe to the circuit board in place of the integrated circuit to test the board prior to installation of the integrated circuit. The fine pitch can also increase crosstalk which limits the frequency at which the circuit can be used. An apparatus of moderate cost which enabled integrated circuits to be readily connected and disconnected from a printed circuit board, and which allowed a probe to be connected in place of the integrated circuit, would be of considerable value.

SUMMARY OF THE INVENTION

In accordance with one embodiment of the present invention, an apparatus of moderate cost is provided which can readily releasably connect an integrated circuit to a circuit board. The apparatus includes a socket that can be readily mounted on the circuit board, the socket forming a largely rectangular cavity which closely receives the integrated circuit. The socket has a lower portion forming vertical through slots, each slot extending parallel to one of the sides of the rectangular socket. An elongated vertically-compressible interface device lies in each of the slots, each interface device having a row of compressible conductors with upper ends pressing against conductive pads on the underside of the integrated circuit, and each compressible conductor having a lower end pressing against a conductive trace on the circuit board. A cover or the like mounts on the socket and presses the integrated circuit downwardly into the socket, to compress the interface devices to interconnect the integrated circuit to the circuit board.

The integrated circuit can be readily removed, and a probe can be inserted into the socket in place of the integrated circuit. The probe has a printed circuit board with contact pads on its lower surface connected to wires of a probe cable. The probe board can be pressed down within the socket to compress the interface devices, to thereby connect the contact pads and therefore the cable wire on the probe, to the traces on the circuit board.

Each interface device can be formed with conductors with center-to-center spacings much less than the center-to-center spacings of the integrated circuit pads or circuit board traces. This avoids the need for precision mounting of the interface device while still assuring that each contact pad on the interface device is connected to a single corresponding trace on the circuit board. A grounding plate can lie in the middle of the socket, immediately below the integrated circuit, to reduce crosstalk between the conductors of the interface device.

The novel features of the invention are set forth with particularity in the appended claims. The invention will be best understood from the following description when read in conjunction with the accompanying drawings.

BRIEF DESCRIPTION OF THE DRAWINGS

FIG. 2 is a plan view of the socket of FIG. 1, with the interface devices and grounding plate in place thereon.

FIG. 3 is a view taken on the line 3—3 of FIG. 2.

FIG. 4 is a view taken on the line 4—4 of FIG. 2.

FIG. 5 is a bottom view of the apparatus of FIG. 2.

FIG. 10 is an isometric view of the interface device of FIG. 1.

FIG. 11 is an isometric view of an alternate interface device which can be used in place of the interface device shown in FIG. 10.

FIG. 12 is a partial sectional view of the interface device of FIG. 10, showing the manner in which it can be used to interconnect contact pads of the integrated circuit to conductive traces of the circuit board of FIG. 1.

DESCRIPTION OF THE PREFERRED EMBODIMENTS

Figure 1:
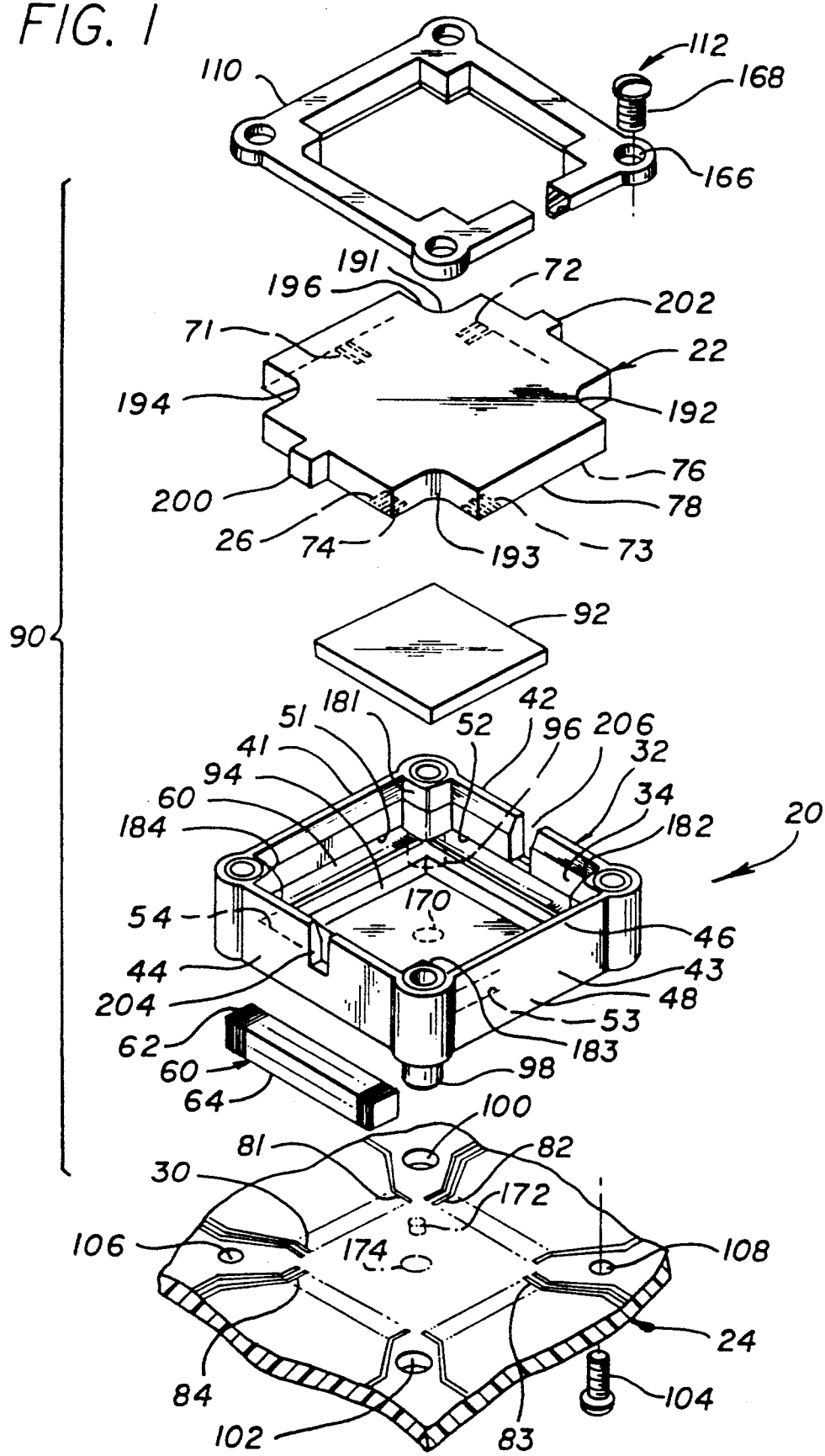
FIG. 1 is an exploded isometric view of a system of the present invention which includes a mounting apparatus and an integrated circuit and circuit board that it interconnects.

FIG. 1 illustrates a mounting apparatus 20 which can mount a largely rectangular chip or IC (integrated circuit) 22 on a circuit board 24 and connect contact pads 26 on the IC to conductive traces 30 on the circuit board. The mounting apparatus 20 includes a socket 32 which has walls forming a largely rectangular cavity 34 with four sides 41-44. The socket has upper and lower portions 46, 48, with the lower portion having four elongated vertical through slots 51-54. Each slot extends parallel to the length of each side 41-44 of the socket and lies adjacent to the corresponding side.

The mounting apparatus also includes four interface devices 60 that each lies in one of the slots 51-54. Each interface device has an upper end 62 designed to engage the contact pads 26 on the IC and has a lower end 64 designed to engage the conductive traces 30 on the circuit board. The integrated circuit contact pads 26 are arranged in four rows 71-74 on a lower surface 76 of the integrated circuit, adjacent to each of the four edge portions 78 of the largely rectangular IC. Similarly, the circuit board conductive traces are arranged in four rows 81-84 on the circuit board. The interface devices are constructed to interconnect all four rows of contact pads to all four rows of conductive traces.

To assemble the assembly or combination 90, applicant installs the four interface devices 60 in the socket 32 by merely slipping them into the slots 41-44. Applicant also places an electrically conductive grounding plate 92 in a recess 94 formed in the lower portion of the socket. The socket is then mounted on the circuit board by lowering it in place until a pair of feet 96, 98 on the socket are received in corresponding locating holes 100, 102 in the circuit board. Four screws such as screw 104 are then projected through each of four holes 100, 102, 106, 108 to securely fasten the socket to the circuit board. The integrated circuit 22 is then lowered into the socket cavity, with the contact pads 26 of the integrated circuit automatically lying on the interface devices 60. Finally, a holdown or cover 110 is laid on the upper portion of the socket, over the integrated circuit therein, and screws 112 are used to fasten the cover in place. As the cover is securely fastened to the upper portion of the socket, it presses down the integrated circuit 22, which firmly compresses the interface devices 60 to assure good interconnections between the integrated circuit and circuit board.

FIG. 10 illustrate details of one of the interface devices 60. The device is formed from a stack of sheets of elastomeric material such as a soft rubber, with alternate sheets such as at conductors 120, 122 being highly electrically conductive, while sheets such as 124 therebetween are electrically insulative. Elastomeric material can be made conductive as by including silver powder in the material. A stack of large area sheets can be adhered together, and plugs can be cut from such a sheet to form each interface device. Each conductor such as 120 has a top 130 which engages a conductive pad on the integrated circuit, and a bottom 132 which engages a conductive trace on the circuit board. It may be noted that the stack can be formed with a hole 134 along the length or axis 136 of the interface device, to increase resilience, and that the outside of the interface device can be circular, oval, or of other shape.

FIG. 11 illustrates another interface device 140 that can be used in place of the interface device of FIG. 10. The interface device 140 includes a flexible circuit board 142 extending in a loop, which forms top and bottom loop sides 144, 146. The flexible circuit board includes a flexible base 150 and conductor in the form of conductive traces such as 152 on the outer face of the flexible circuit board. The insulative base 150 has insulative portions that lie substantially between the conductive traces to separate them. An elastomeric member 154 lies between the opposite sides 144, 146 of the circuit board to facilitate elastic compression and expansion of the interface device. Of course, the loop of the flexible circuit board could be extended so the circuit board extends in a substantially 360° loop.

It is possible to construct the interface device so that the spacing between adjacent conductor is equal to the spacing between conductive pads on the integrated circuit, and also the spacing between corresponding traces on the circuit board. However, where the conductive pads and traces are arranged at a fine pitch, as where the spacing is 0.5 mm or less, it then would require the interface devices to be accurately positioned within the socket slots. Applicant can avoid the need for accurate positioning of the interface device by spacing the conductors such as 120, 122 in FIG. 10, closer together than the spacing of the conductive pads and circuit board traces.

FIG. 12 shows a situation where the center-to-center spacing A of the integrated circuit board pads 26 (and of the conductive traces 30) is considerably greater than the center-to-center spacing B of adjacent conductors such as 122, 126 of the interface device 60. The illustration in FIG. 12 shows one type of "worst case" situation, where one conductor 126 just misses engaging a contact pad 26. However, the adjacent-edge-spacing C between adjacent conductors 126, 128 is less than the width of each contact pad 26 or each conductive trace 30 on the circuit board, which assures that the entire width of a conductor 128 will engage a conductive pad and the entire width of a conductor will engage a circuit board trace. It is noted that the center-to-center spacing B between conductors can be slightly or greatly smaller than the center-to-center spacing of the IC conductive pads. It is necessary that the gap C between conductors be less than the width F of an IC conductive pad. Also, the width E of a conductor must be less than the gap D between IC conductive pads. To avoid the need for precise alignment of the IC contact pads with the compressible conductors of the interface device, the center spacing of the compressible conductor should be at least ten percent less than the center spacing of the IC conductive pads and of the circuit board traces.

Figure 6:
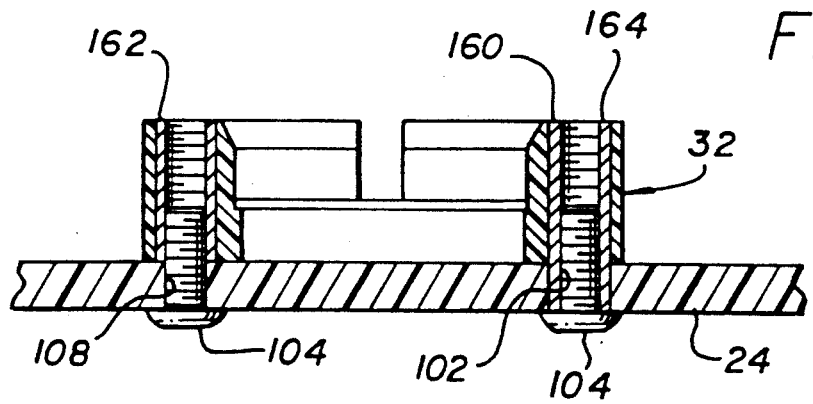
FIG. 6 is a view taken on the line 6—6 of FIG. 2, and showing the socket mounted on a circuit board.
Figure 7:
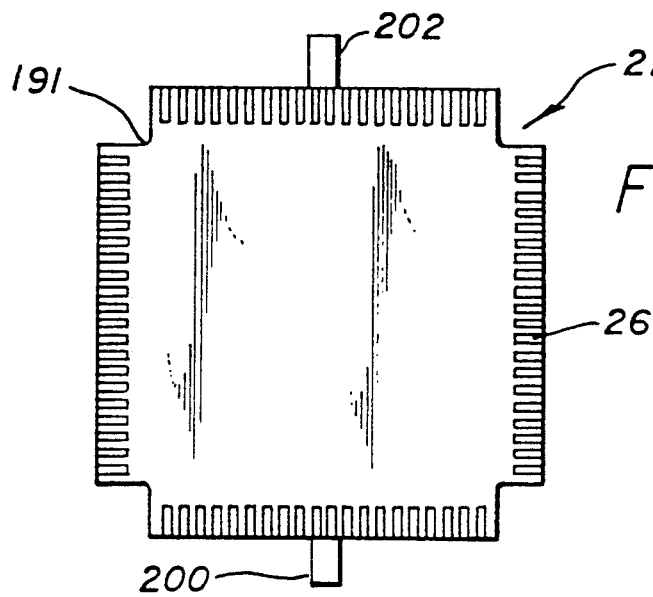
FIG. 7 is a bottom view of the integrated circuit of FIG. 1.
Figure 8:
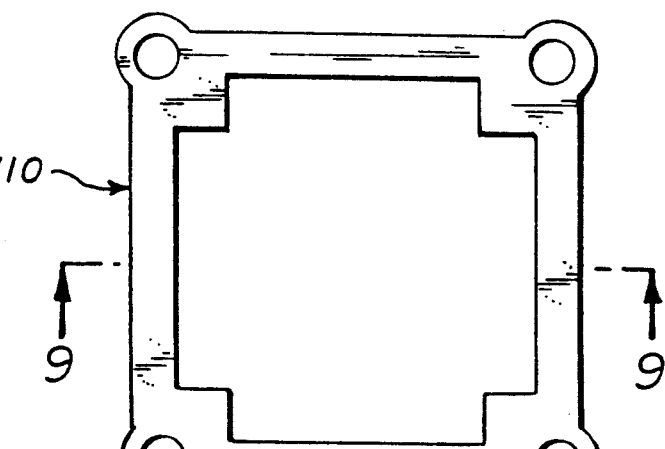
FIG. 8 is a plan view of the cover of FIG. 1.

FIG. 6 illustrates the manner in which the socket 32 is secured to the circuit board 24. The socket includes four internally threaded sleeves, including two types 160, 162 shown in FIG. 6. Both sleeves are internally threaded, but sleeves 160 are longer, by about the thickness of the circuit board 24, than the sleeves 162. The screws 104 pass through holes 102, 108 in the circuit board and threadably engage the sleeves to securely hold down the socket to the circuit board. Each of the sleeves is fastened to the socket, as by adhesive or by threads at the outside of the sleeve that screw into internal threads in a socket hole. The upper portion 164 of each sleeve threadably receives the shank of one of the screws 112 (FIG. 1) that projects through a cover hole 166 with its head 168 over the cover, to hold down the cover to the socket.

The ground plate 92 (FIG. 1) is provided to reduce crosstalk between adjacent contacts of each interface device. The grounding plate 92 should be maintained at a predetermined constant potential such as ground potential, which can be accomplished in a number of ways. FIG. 1 shows, in phantom lines, a hole 170 in a bottom wall of the socket, a compressible conductive device 172 that can fit into the hole 170, and a grounded conductive trace 174 on the circuit board. As shown in FIG. 3, the grounding plate 92 lies close to the conductors of the interface device 60, to provide considerable capacitance between each conductor of the interface device 60 and the grounding plate. Where the capacitance between the grounding plate and the conductors of the interface device is of the same order of magnitude as the capacitance between adjacent conductors of the interface device, the presence of the grounding plate will reduce crosstalk.

The integrated circuit 22 of FIG. 1 is closely held in position within the socket cavity 34 by the engagement of each of four vertical edges 181-184 at each corner of the largely rectangular socket, with the walls of a corresponding cutout 191-194 formed in each corner area 196 of the integrated circuit. By providing contact along four short vertical lines, instead of four long horizontal edges lying adjacent to the contact pads of the circuit, applicant moves the precision surfaces away from the contact pad for easier manufacture, and uses shorter precision locating surfaces 181-184. The integrated circuit has a pair of sidewardly projecting tabs 200, 202 that are received in corresponding tab-receiving vertical slots 204, 206 formed in opposite sides of the socket. This arrangement facilitates removal of the integrated circuit by pulling up the accessible tabs. The integrated circuit may tend to become stuck in the socket because of very close fitting of the cutout walls of the integrated circuit with the locating edges 181-184 of the socket.

Figure 9:
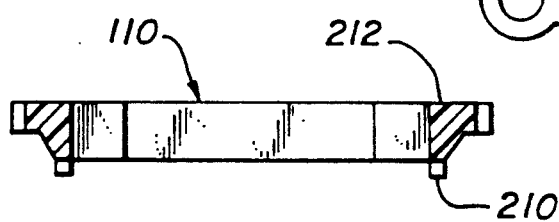
FIG. 9 is a view taken on the line 9—9 of FIG. 8.

As shown in FIG. 9, the cap or cover 110 preferably includes an elastic gasket 210 lying under a rigid plastic molded cover part 212. The elastic gasket 210 can press down firmly against the integrated circuit to help press it down substantially uniformly against all four interface devices, without excessive pressure, when the cover is screwed down against the socket.

Figure 13:
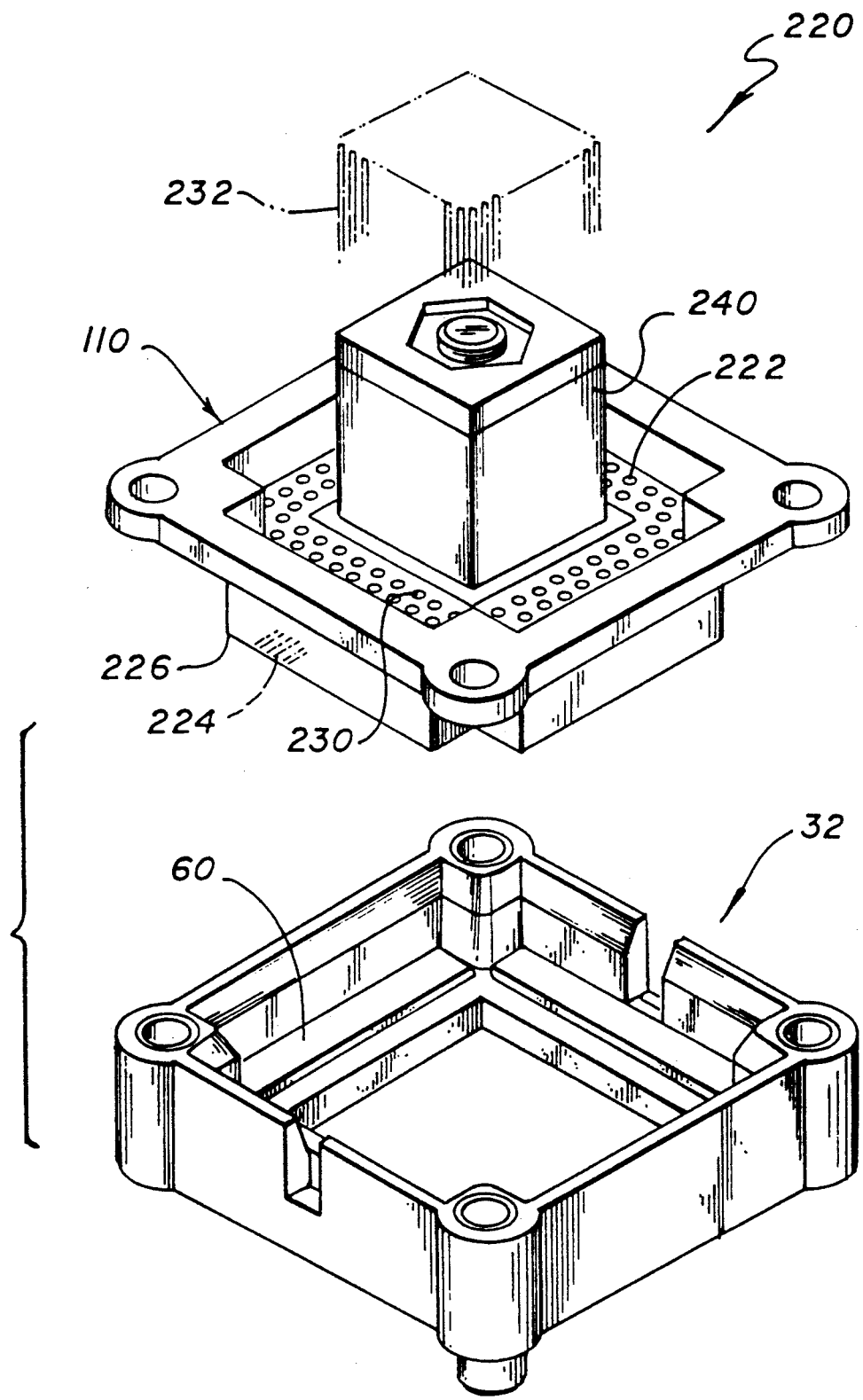
FIG. 13 is a partial isometric exploded view of a probe and of the socket of FIG. 1.

FIG. 13 shows how the mounting apparatus, including the socket 32 and cover 110 can be used to connect a probe 220 to a circuit board on which the socket 32 is mounted, in place of the integrated circuit shown at 22 in FIG. 1. The probe 220 includes a probe board 222 with rows of conductive traces or pads 224 on its lower surface 226. Each conductive pad 224 is connected to a plated-through hole 230, which is designed to receive the conductors of flat cables such as 232. The probe board 222 can fit into the socket 32 in place of the integrated circuit, and connect to the interface devices such as 60, in the same manner as the integrated circuit. A different or same cover 110 can be used to hold down the probe board 222.

Figure 14:
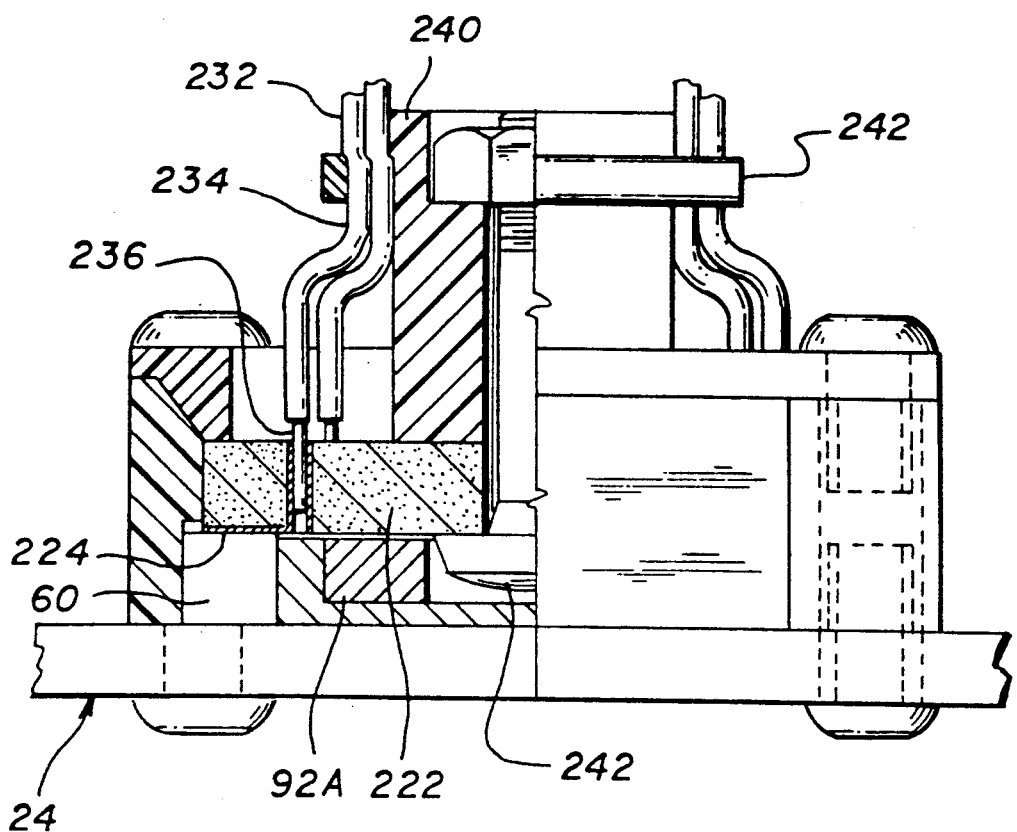
FIG. 14 is a partially sectional view of the probe and socket of FIG. 13, shown mounted on a circuit board.
Figure 15:
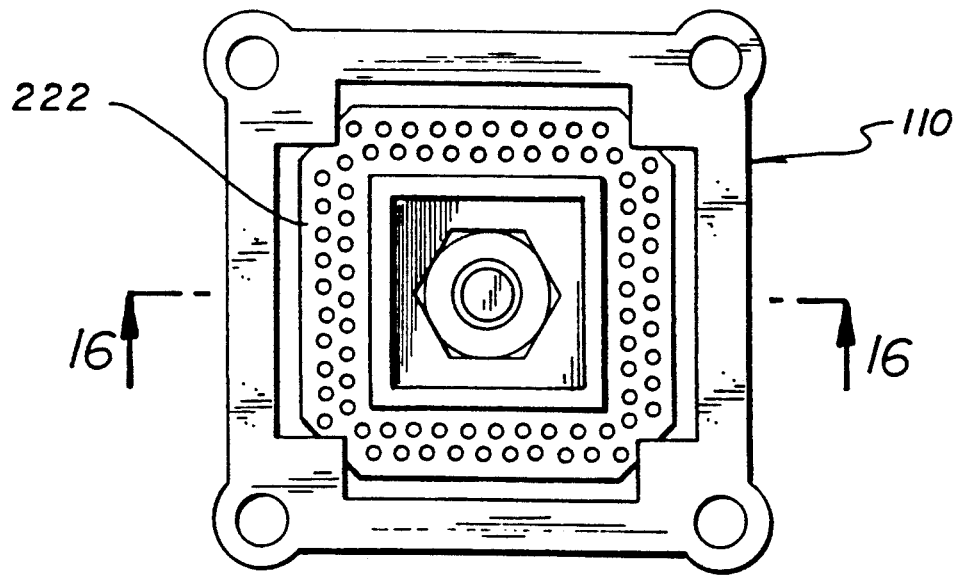
FIG. 15 is a partial plan view of the probe and cover of FIG. 13.
Figures 16, 17, 18:
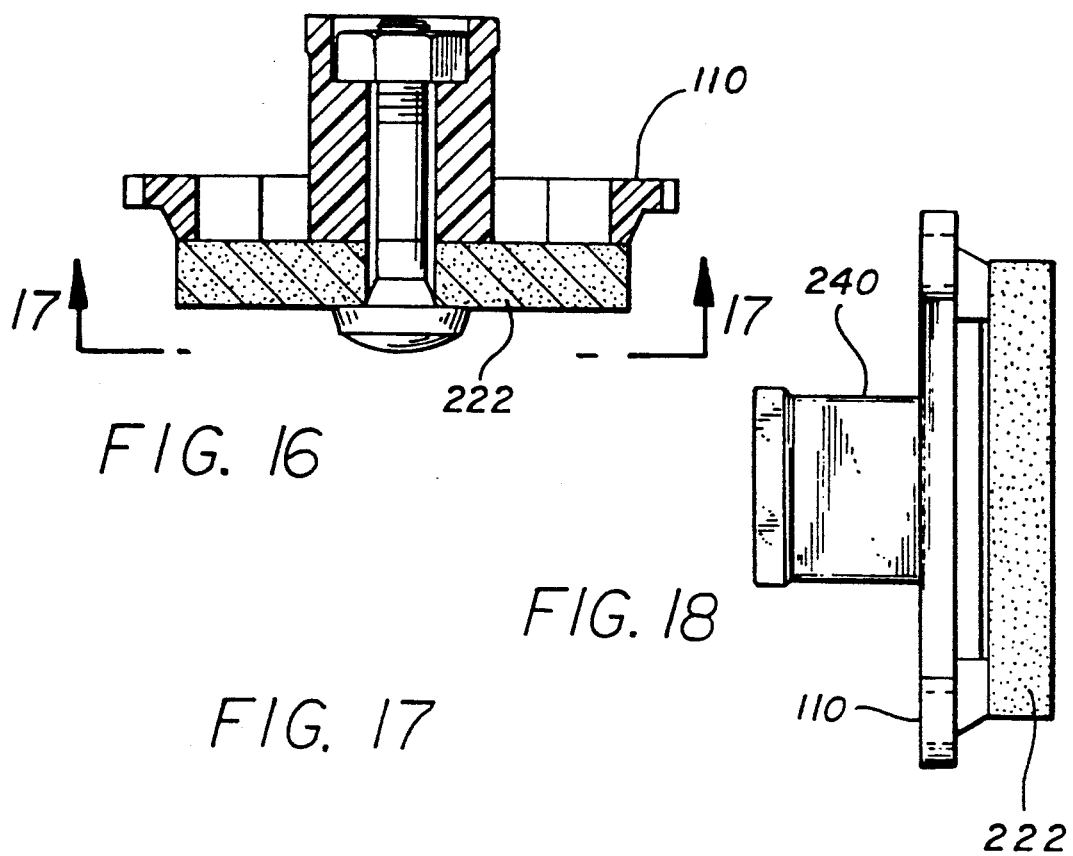
FIG. 16 is a view taken on the line 16—16 of FIG. 15.
FIG. 17 is a view taken on the line 17—17 of FIG. 16.
FIG. 18 is a side elevation view of the apparatus of FIG. 15.
Figure 19:
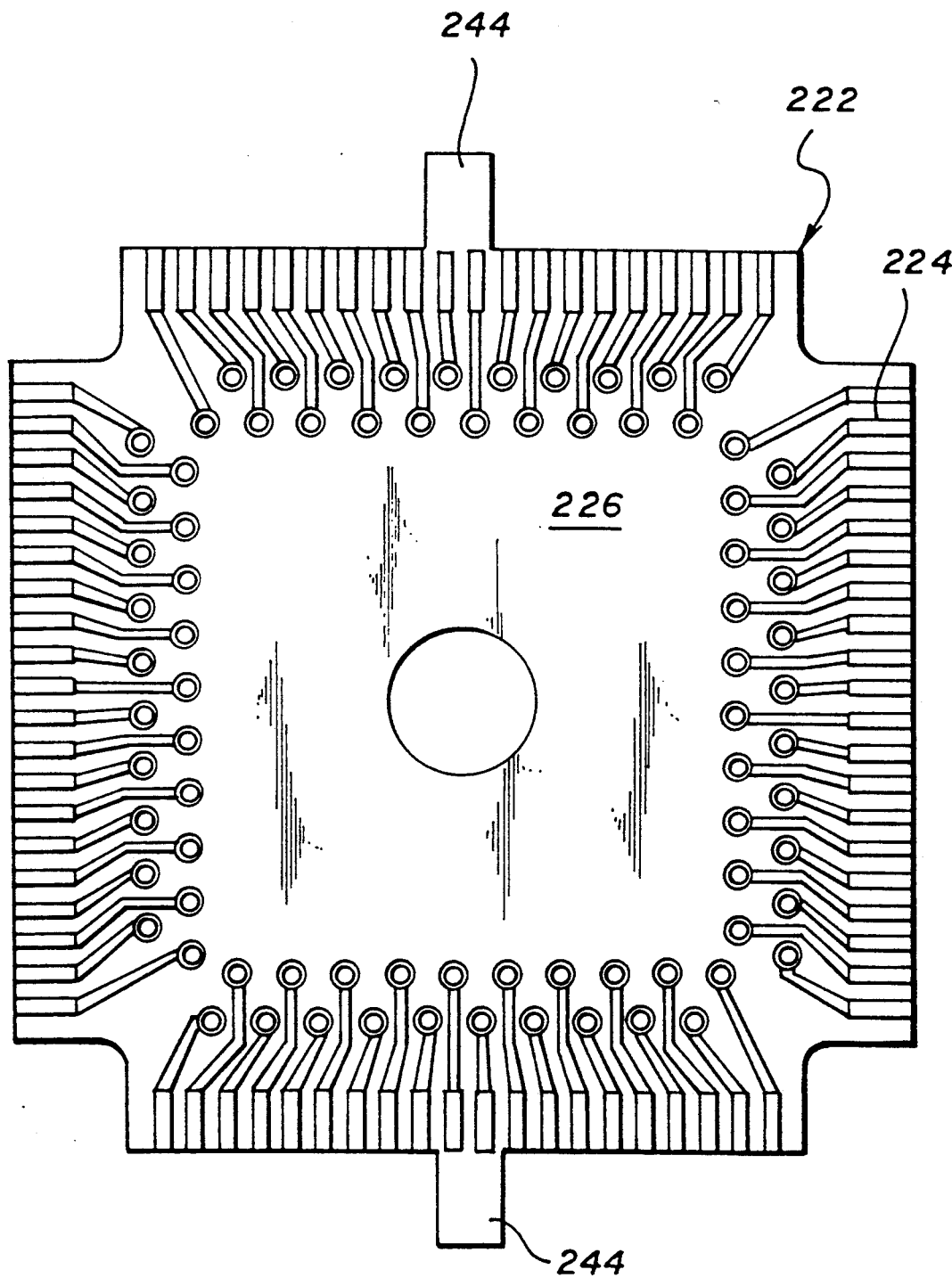
FIG. 19 is a plan view of just the probe board of FIG. 17.

FIG. 14 shows details of the assembly of FIG. 13, showing wires 234 of the flat cable each having probe conductors 236 inserted into one of the holes of the probe board 222 to connect to a pad 224 that engages the interface device 60. The probe board 222 is coupled to the cables such as 232 by a center post 240. The center post 240 is held to the probe board by a bolt 242 which lies in a recess of a modified ground plane 92A. A band 242 holds the flat cables to the center post. The probe board 222 can have the outline shown in FIG. 19, which includes tabs 244 to enable its removal, and which corresponds to the tabs on the integrated circuit described earlier.

While terms such as "upper", "lower", "vertical", "horizontal" and the like have been used herein to aid in the description of the invention, it should be understood that the parts can be used in any orientation with respect to gravity.

Thus, the invention provides apparatus for connecting conductive pads on an integrated circuit to conductive traces on a circuit board, which facilitates insertion and removal of the integrated circuit and its replacement by a probe, in a relatively low cost construction. The apparatus includes a socket with walls forming a largely rectangular cavity and having a lower portion with a plurality of slots that each holds an interface device. Each interface device has multiple contacts and is elastically compressible, so downward pressure of an integrated circuit or probe board on the top of the interface device, assures connection of the conductors of the interface device with both the contact pads on the integrated circuit or probe and the traces on the circuit board. A grounding plate can lie in a lower portion of the socket where it provides substantial coupling to the conductors of the interface device as well as to the contact pads and circuit board traces, to minimize crosstalk between conductors. The interface device can be provided with conductors at a different pitch than the contact pads and circuit board traces, to assure connection along vertical pads without requiring precision alignment of the interface device with the contact pads and circuit board traces.

Although particular embodiments of the invention have been described and illustrated herein, it is recognized that modifications and variations may readily occur to those skilled in the art, and consequently, it is intended that the claims be interpreted to cover such modifications and equivalents.

We claim:

1. A method for applying test signals to conductive traces on a circuit board and for mounting an integrated circuit on the circuit board so that conductive pads on the integrated circuit are connected to the same conductive traces on the circuit board, comprising:

mounting a socket on said board, wherein said socket includes a cavity, an elongated horizontal slot under a portion of said cavity, and an elastically compressible interface device in said slot with the bottom of said device lying on said traces of said circuit board and with the top of said device lying in said cavity, wherein said interface device includes a row of spaced compressible conductors that each has a portion at said device top and a portion at said device bottom;

coupling the cable conductors of a probe cable to a probe board which has a lower face with a plurality of contact pads each electrically connected to one of said cable conductors, inserting said probe board into said socket cavity, and pressing said board down so said contact pads engage said interface device;

removing said board from said cavity, and inserting an integrated circuit into said cavity with said conductive pads lying over said interface device, and pressing down said integrated circuit to press said pads firmly against said interface device.

2. Apparatus for connecting an integrated circuit having a plurality of rows of contact pads thereon, to a circuit board having an upper surface with a plurality of rows of conductive traces thereon and a lower surface, which includes a socket which can mount to said circuit board and which has a cavity that can receive said integrated circuit and a plurality of horizontally elongated vertical through slots which lie under said rows of contact pads when said integrated circuit lies in said cavity, including an elongated compressible interface device in each of said slots and a holdown which can pres down an integrated circuit lying in said socket so the integrated circuit contact pads are connected to said board traces through said interface devices, comprising:

a probe for connection to said circuit board conductive traces, including a probe board which has upper and lower surfaces and a plurality of rows of conductive probe traces on said lower surface at locations corresponding to said contact pads of said integrated circuit, said probe also including a cable with a plurality of probe conductors each connected to one of said probe traces; said probe is constructed to fit into said socket cavity in place of said integrated circuit, with each of said rows of probe traces pressing down against one of said compressible interface devices.

3. The apparatus described in claim 2 wherein:
each of said interface devices comprises a flexible circuit board having a first surface and having a plurality of parallel conductive traces on said first surface, said flexible circuit board being bent in a loop having first and second loop sides, so first portions of said traces on a first side of said loop face upwardly and second portions of said traces on a second side of said loop face downwardly, said interface device also including an elastomeric member between said loop sides to resiliently resist compression of said loop.

4. The apparatus described in claim 2 including:
a grounding plate lying at the bottom of said socket cavity and maintained at a constant potential, said grounding plate having an edge extending parallel to and lying adjacent to each of said interface devices.

5. The apparatus described in claim 2 wherein:
said circuit board has a plurality of foot-receiving through holes and said socket has a plurality of locating feet each projecting into one of said foot-receiving holes, with at least some of said feet each having a hollow lower end with internal threads;
a plurality of screws each having a head lying against the lower surface of said circuit board, and a threaded shank threaded into one of said feet.

6. The apparatus described in claim 5 wherein:
said socket has a plurality of internally threaded sleeves, with each sleeve having a lower portion forming part of one of said locating feet, and with each sleeve having an upper portion, and said holdown has a plurality of through holes each aligned with one of said sleeves;
a plurality of screws each having a shank extending through a hole in said holdown and threadably engaged with said sleeve and with each screw having a head lying over said holdown.

7. A combination of a largely rectangular integrated circuit which has four sides and a plurality of rows of conductive pads each extending along one of said sides, a circuit board which has a upper surface holding a plurality of rows of conductive traces corresponding to said rows of pads, a socket mounted on said circuit board, said socket having four sides forming a largely rectangular cavity which closely receives said integrated circuit and said socket having a bottom portion with a plurality of elongated through slots each extending parallel to one of said sides, and a plurality of interface devices each lying in one of said slots and connecting said conductive pads on said integrated circuit to said traces on said circuit board, comprising:
an electrically conductive grounding plate lying at the bottom of said cavity and having a plurality of edges each lying adjacent to one of said interface devices.

8. The apparatus described in claim 7 wherein:
each of said interface devices comprises a flexible circuit board having a first surface and having a plurality of parallel conductive traces on said first surface, said flexible circuit board being bent in a loop having first and second loop sides, so first portions of said traces on a first side of said loop face upwardly and second portions of said traces on a second side of said loop face downwardly, said interface device also including an elastomeric member between said loop sides to resiliently resist compression of said loop.

9. An interface device for connecting a row of conductive pads to a row of conductive traces, where one of a said rows lies above the other, comprising:
a flexible circuit board having a first surface and having a plurality of parallel conductive trace parts on said first surface, said flexible circuit board being bent in a loop having first and second loop sides, so first portions of said trace parts on a first side of said loop face upwardly to engage said pads and second portions of said trace parts on a second side of said loop face downwardly to engage said traces;
said interface device also including an elastomeric member between said loop sides to resiliently resist compression of said loop.

* * * * *